United States Patent
Okako et al.

(10) Patent No.: US 11,302,401 B2
(45) Date of Patent: Apr. 12, 2022

(54) FLASH MEMORY SYSTEM

(71) Applicant: TDK CORPORATION, Tokyo (JP)

(72) Inventors: Norikazu Okako, Tokyo (JP); Yugi Ito, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/080,123

(22) Filed: Oct. 26, 2020

(65) Prior Publication Data
US 2021/0158878 A1 May 27, 2021

(30) Foreign Application Priority Data

Nov. 21, 2019 (JP) .............................. JP2019-210155

(51) Int. Cl.
| | |
|---|---|
| *G11C 7/00* | (2006.01) |
| *G11C 16/30* | (2006.01) |
| *G11C 16/10* | (2006.01) |
| *G11C 7/10* | (2006.01) |
| *G11C 16/26* | (2006.01) |

(52) U.S. Cl.
CPC ............ *G11C 16/30* (2013.01); *G11C 7/1057* (2013.01); *G11C 7/1084* (2013.01); *G11C 16/10* (2013.01); *G11C 16/26* (2013.01)

(58) Field of Classification Search
CPC ..... G11C 16/30; G11C 7/1057; G11C 7/1084; G11C 16/10; G11C 16/26; G11C 5/143; G11C 5/145; G11C 16/225
See application file for complete search history.

(56) References Cited

U.S. PATENT DOCUMENTS 6,856,556 B1 * 2/2005 Hajeck ............... G06K 19/0701
365/189.11

FOREIGN PATENT DOCUMENTS

JP         2016-115171 A      6/2016

* cited by examiner

*Primary Examiner* — Xiaochun L Chen
(74) *Attorney, Agent, or Firm* — Oliff PLC (57) ABSTRACT

A flash memory system includes a memory controller, flash memory, power supply circuit, and control circuit. The power supply circuit includes a power supply terminal fed with external power, a step-up circuit for boosting a first voltage associated with the external power and thereby generating a second voltage higher than the first voltage, a capacitor charged at the second voltage, and a first step-down circuit for lowering the second voltage and thereby generating a third voltage lower than the second voltage, and supplying the generated third voltage to the flash memory as the operating voltage. The control circuit includes a circuit for controlling the active or inactive state of the flash memory based on the level of the third voltage, and a circuit for controlling the active or inactive state of the memory controller based on both the levels of the voltage of the external power and the third voltage.

7 Claims, 7 Drawing Sheets

FLASH MEMORY SYSTEM

CROSS-REFERENCE TO RELATED APPLICATION

This application claims the benefit of Japanese Patent Application No. 2019-210155, filed on Nov. 21, 2019, the entire disclosure of which is incorporated by reference herein.

FIELD

This application relates to a flash memory system.

BACKGROUND

Unexamined Japanese Patent Application Publication No. 2016-115171 discloses a flash memory system. In this flash memory system, sudden shutdown of external power initiates power supply using the electric charge stored in a backup capacitor, so as maintain the operating state of the flash memory system.

The disclosed flash memory system includes a step-up circuit for boosting the voltage of external power, a backup capacitor charged at the boosted voltage, and step-down circuits for lowering the boosted voltage and supplying the lowered voltage to a flash memory and a memory controller as operating voltage. After power shutdown, when the voltage of external power lowers to a first threshold level, the step-up circuit stops the voltage boosting operation, and the flash memory and the memory controller are fed with power using the electric charge stored in the capacitor. When the voltage of external power lowers to a third threshold level, the memory controller becomes a reset state and stops the operation, while the flash memory keeps operating using the electric charge stored in the capacitor. The arrival of the operating voltage at a fourth threshold level makes the flash memory to a write protect state. After power-on, when the voltage of external power rises to the first threshold level, the step-up circuit starts the voltage boosting operation and causes the backup capacitor to be charged. The arrival of the voltage of external power at the third threshold level causes the memory controller to exit the reset state. The arrival of the boosted voltage at a second threshold level causes the step-down circuits to start the voltage lowering operations. The arrival of the lowered voltage at the fourth threshold level causes the flash memory to exit the write protect state.

After power-on, the termination of the write protect state of the flash memory should preferably precede the termination of the reset state of the memory controller, because the memory controller should recognize the flash memory during boosting of the system. In order to meet this requirement, a component, such as a delay capacitor, is used to control the timing of termination of the rest state of the memory controller. The timing of termination of the reset state is determined with a certain margin in view of the charging time of the backup capacitor and the temperature characteristics of the delay capacitor, and thus tends to be delayed more than necessary.

SUMMARY

The flash memory system is, however, required to be boosted for a shorter time in order to reduce the time for boosting the host system connected to the flash memory system. The flash memory system is also required to be stably boosted regardless of a variation in the charging time of the backup capacitor.

An objective of the disclosure, which has been accomplished in view of the above situations, is to provide a flash memory system that can be certainly boosted for a shorter time.

A flash memory system according to an aspect of the disclosure includes: a memory controller; a flash memory configured to be controlled by the memory controller; a power supply circuit configured to supply operating voltage to the memory controller and the flash memory; and a control circuit configured to control active or inactive states of the memory controller and the flash memory. The power supply circuit includes: a power supply terminal fed with external power; a step-up circuit for boosting a first voltage associated with the external power and thereby generating a second voltage higher than the first voltage; a capacitor charged at the second voltage; and a first step-down circuit for lowering the second voltage and thereby generating a third voltage lower than the second voltage, and supplying the generated third voltage to the flash memory as the operating voltage. The control circuit includes: a circuit for controlling the active or inactive state of the flash memory based on the level of the third voltage; and a circuit for controlling the active or inactive state of the memory controller based on both of the level of voltage of the external power and the level of the third voltage. Alternatively, the control circuit includes: a circuit for controlling the active or inactive state of the flash memory based on the level of the second voltage; and a circuit for controlling the active or inactive state of the memory controller based on both of the level of voltage of the external power and the level of the second voltage.

The disclosure can provide a flash memory system that can be certainly boosted for a shorter time by controlling the active or inactive state of the memory controller based on both of the levels of the voltage of the external power and the third voltage, or by controlling the active or inactive state of the memory controller based on both of the levels of the voltage of the external power and the second voltage.

BRIEF DESCRIPTION OF THE DRAWINGS

A more complete understanding of this application can be obtained when the following detailed description is considered in conjunction with the following drawings, in which:

FIG. 2 is a voltage waveform diagram illustrating a variation in power supply voltage after power-on;

FIG. 3 is a time chart illustrating signals input to a logic circuit and a signal output from the logic circuit after power-on;

DETAILED DESCRIPTION

Flash memory systems according to embodiments of the disclosure will now be described with reference to the accompanying drawings.

Figure 1:
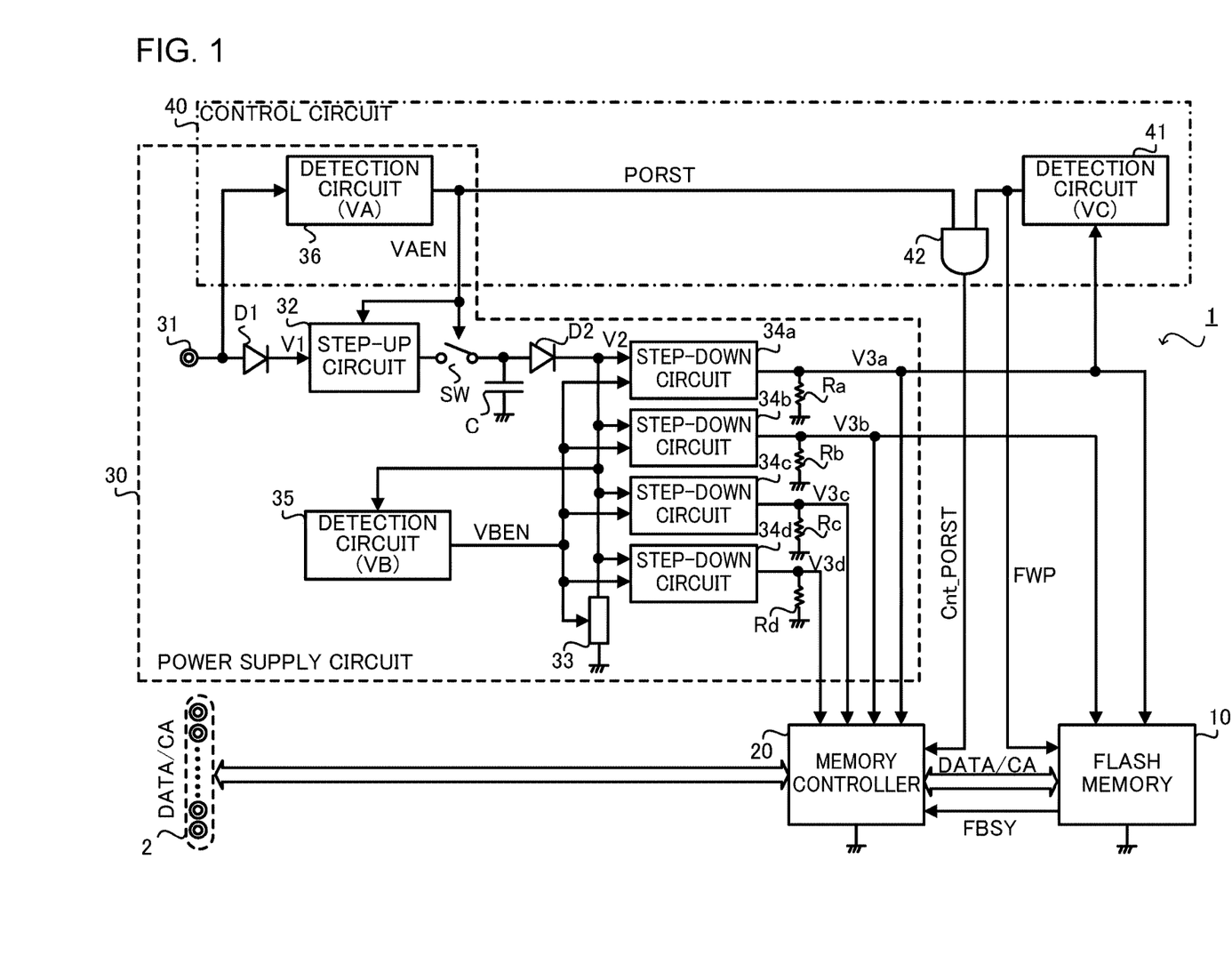
FIG. 1 is a block diagram illustrating a configuration of a flash memory system according to Embodiment 1 of the disclosure.

FIG. 1 is a block diagram illustrating a configuration of a flash memory system 1 according to Embodiment 1 of the disclosure.

The flash memory system 1 is equipped with a flash memory 10, which is a non-volatile memory (for example, solid state drive (SSD)), a memory controller 20 for controlling operations of the flash memory 10, a power supply circuit 30 for supplying operating voltage to the flash memory 10 and the memory controller 20, and a control circuit 40 for controlling the active or inactive states of the flash memory 10 and the memory controller 20.

The flash memory 10 is a non-volatile memory in which user data can be deleted and rewritten. The flash memory 10 includes, for example, one or more flash memory chips.

The memory controller 20 accesses the flash memory 10 and controls reading and writing of data, for example. The memory controller 20 includes, for example, control chips integrated on a single semiconductor chip.

The power supply circuit 30 includes a power supply terminal 31 fed with power supply voltage (for example, 3.3 V) from an external source, a step-up circuit 32 for boosting the power supply voltage, a capacitor C charged at the boosted power supply voltage, a switching circuit SW for connecting or disconnecting the step-up circuit 32 to or from the capacitor C, a discharging circuit 33 for discharging the electric charge stored in the capacitor C, step-down circuits 34a to 34d for lowering the boosted power supply voltage, a detection circuit 35 for monitoring the boosted power supply voltage and generating an enable signal VBEN that controls operations of the step-down circuits 34a to 34d, and a detection circuit 36 for monitoring the power supply voltage and generating an enable signal VAEN that controls operations of the step-up circuit 32. The power supply circuit 30 is fed with power supply voltage from the external source via the power supply terminal 31. The step-down circuits 34a and 34b are each an exemplary first step-down circuit for supplying the lowered power supply voltage to the flash memory 10. The step-down circuits 34a to 34d are each an exemplary second step-down circuit for supplying the lowered power supply voltage to the memory controller 20.

The step-up circuit 32 has an input terminal connected to the power supply terminal 31 via an element for preventing backflow of current, such as a diode D1 or switching circuit SW. The input terminal of the step-up circuit 32 is fed with a first voltage V1 associated with the power supply voltage fed to the power supply terminal 31. This first voltage V1 is boosted by the step-up circuit 32. The voltage (for example, 5.0 V) boosted by the step-up circuit 32 is applied to the capacitor C, so that the capacitor C is able to store a larger amount of electric charge.

The capacitor C is responsible for temporary supply of operating voltage in the case of shutdown of power supply voltage (external power) fed via the power supply terminal 31. The voltage output from the step-up circuit 32 is applied to the capacitor C via a switching circuit SW. The flash memory 10 executes a data writing process for each page. This writing process requires a relatively long time (for example, several to several tens of milliseconds). The capacitor C can achieve continuous supply of operating voltage until completion of the writing process if external power is shut down during the writing process.

The sudden shutdown of external power makes the switching circuit SW to the off state. The switching circuit SW in the off state prevents the electric charge stored in the capacitor C from being discharged to the side adjacent to the step-up circuit 32. The electric charge stored in the capacitor C is fed to the input terminals of the step-down circuits 34a to 34d as backup power. The on or off state of the switching circuit SW is controlled by the enable signal VAEN output from the detection circuit 36.

The voltage boosted by the step-up circuit 32 (that is, the voltage output from the step-up circuit 32) is input to the step-down circuits 34a to 34d via the switching circuit SW and a diode D2 for preventing backflow. The step-down circuits 34a to 34d lower the input second voltage V2, thereby generating third voltages V3a and V3b to be fed to the flash memory 10 as the operating voltage, and generating fourth voltages V3c and V3d to be fed to the memory controller 20. The third voltages V3a and V3b are also function as fourth voltages fed to the memory controller 20 as the operating voltage. The output terminals of the step-down circuits 34a to 34d are grounded via the respective resistors Ra to Rd so as to stabilize the power supply wiring after power shutdown.

The discharging circuit 33 is a switching circuit including a transistor, for example. The discharging circuit 33 in the conductive state can cause the electric charge stored in the capacitor C to be discharged. The discharging circuit 33 is used to discharge the residual electric charge.

The detection circuit 35 monitors the level of the second voltage V2 to be input to the step-down circuits 34a to 34d and generates the enable signal VBEN that controls operations of the step-down circuits 34a to 34d and the discharging circuit 33. The detection circuit 35 compares the second voltage V2 with a threshold level VB. For example, if the second voltage V2 rises after power-on and reaches the threshold level VB, the detection circuit 35 activates the enable signal VBEN (for example, to a high level). This activation causes the step-down circuits 34a to 34d to start the operations and makes the discharging circuit 33 to the non-conductive state. In contrast, if the second voltage V2 lowers after power shutdown and goes below the threshold level VB, the detection circuit 35 changes the enable signal VBEN to a signal level indicating deactivation (for example, to a low level). This change causes the step-down circuits 34a to 34d to stop the operations, and makes the discharging circuit 33 to the conductive state, thereby discharging the electric charge from the capacitor C.

The detection circuit 36 monitors the voltage level of power fed from the external source and generates the enable signal VAEN that controls operations of the step-up circuit 32 and the switching circuit SW. The detection circuit 36 also generates a signal that controls the active or inactive state of the memory controller 20 and thus serves as a component of the control circuit 40, as described later. The detection circuit 36 compares the voltage of the external power with a threshold level VA (first threshold level). For example, if the voltage of the external power rises after power-on and reaches the threshold level VA, the detection circuit 36 activates the enable signal VAEN (for example, to a high level). This activation causes the step-up circuit 32 to start the operations and makes the switching circuit SW to the on state. In contrast, if the voltage of the external power lowers after power shutdown and goes below the threshold level VA, the detection circuit 36 changes the enable signal VAEN to a signal level indicating deactivation (for example, to a low level). This change causes the step-up circuit 32 to stop the operations and makes the switching circuit SW to the off state, so that the electric charge stored in the capacitor C is fed to the step-down circuits 34a to 34d as backup power.

The control circuit 40 includes the detection circuit 36 for monitoring the voltage of the external power and outputting a detection signal PORST (first detection signal), a detection circuit 41 for monitoring the third voltage V3a output from the step-down circuit 34a and outputting a write protect signal FWP (second detection signal), and a logic circuit 42 for receiving the detection signal PORST (first detection signal) and the write protect signal FWP (second detection signal) and outputting the logical and between these signals.

The detection circuit 36 outputs the enable signal VAEN that controls the timing of activation of the step-up circuit 32, as described above, and also outputs the detection signal PORST, which is used to generate a power-on reset control signal Cnt_PORST that makes the memory controller 20 to the active or inactive state. That is, the detection circuit 36 serves as both of a component of the power supply circuit 30 and a component of the control circuit 40. If the voltage of the external power is lower than the threshold level VA, the detection circuit 36 sets the detection signal PORST to a reset level (for example, low level). In contrast, if the voltage of the external power reaches at least the threshold level VA, the detection circuit 36 sets the detection signal PORST to a reset termination level (for example, high level), which is a signal level indicating termination of the reset state. The threshold level VA is defined at a level so as to ensure normal operations of the step-up circuit 32 and the flash memory system 1.

The detection signal PORST is input to the logic circuit 42, as well as the write protect signal FWP (second detection signal) output from the detection circuit 41.

The detection circuit 41 monitors the level of the operating voltage to be input to the flash memory 10, that is, the level of the third voltage V3a output from the step-down circuit 34a, and generates the write protect signal FWP that makes the flash memory 10 to the active or inactive state. For example, if the third voltage V3a rises after power-on and reaches the threshold level VC (second threshold level), the detection circuit 41 changes the write protect signal FWP to a write protect termination level (for example, high level), which is a signal level indicating termination of the write protect state. In contrast, if the third voltage V3a lowers after power shutdown and goes below the threshold level VC, the detection circuit 41 changes the write protect signal FWP to a write protect level (for example, low level). The threshold level VC is defined at an operating voltage level so as to ensure a writing process of the flash memory 10. The write protect signal FWP is input to the flash memory 10. The input write protect signal FWP at the write protect level inhibits the writing process of the flash memory 10. The threshold level VC should preferably be defined to be higher than the threshold level VB. This definition can make the flash memory 10 after power shutdown to the write protect state in advance of the stop of the operations of the step-down circuits 34a to 34d.

The logic circuit 42 includes an AND circuit. The logic circuit 42 outputs the power-on reset control signal Cnt_PORST that makes the memory controller 20 to the active or inactive state. The detection signal PORST output from the detection circuit 36 and the write protect signal FWP output from the detection circuit 41 are input to the logic circuit 42. The logic circuit 42 then outputs the power-on reset control signal Cnt_PORST, which is a signal corresponding to the logical and between the input signals. The signal output from the logic circuit 42 is input to the input terminal for power-on reset control signals of the memory controller 20. In response to a change of the power-on reset control signal Cnt_PORST to the reset level, the memory controller 20 is reset and stops the operations.

The detection circuit 35, 36, or 41 may change the detection signal immediately after arrival of the monitored voltage at the threshold level, or may change the detection signal if the monitored voltage has been higher than the threshold level for a predetermined time.

Operations of the flash memory system 1 will now be explained with reference to FIGS. 2 to 5.

Figure 2:
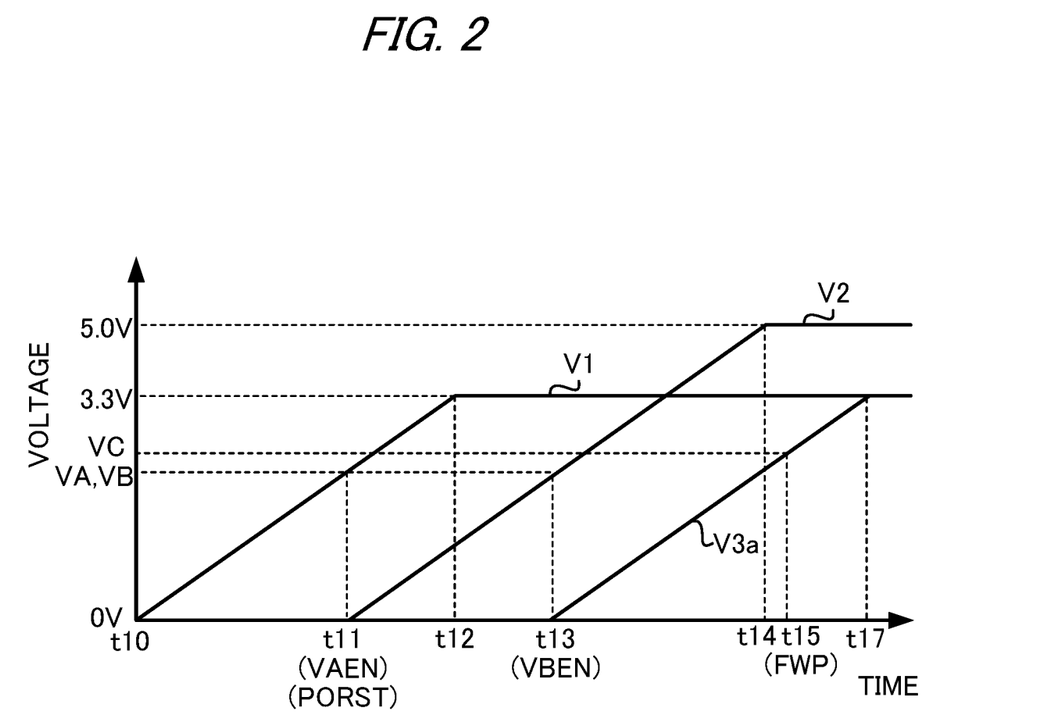
Figure 3:
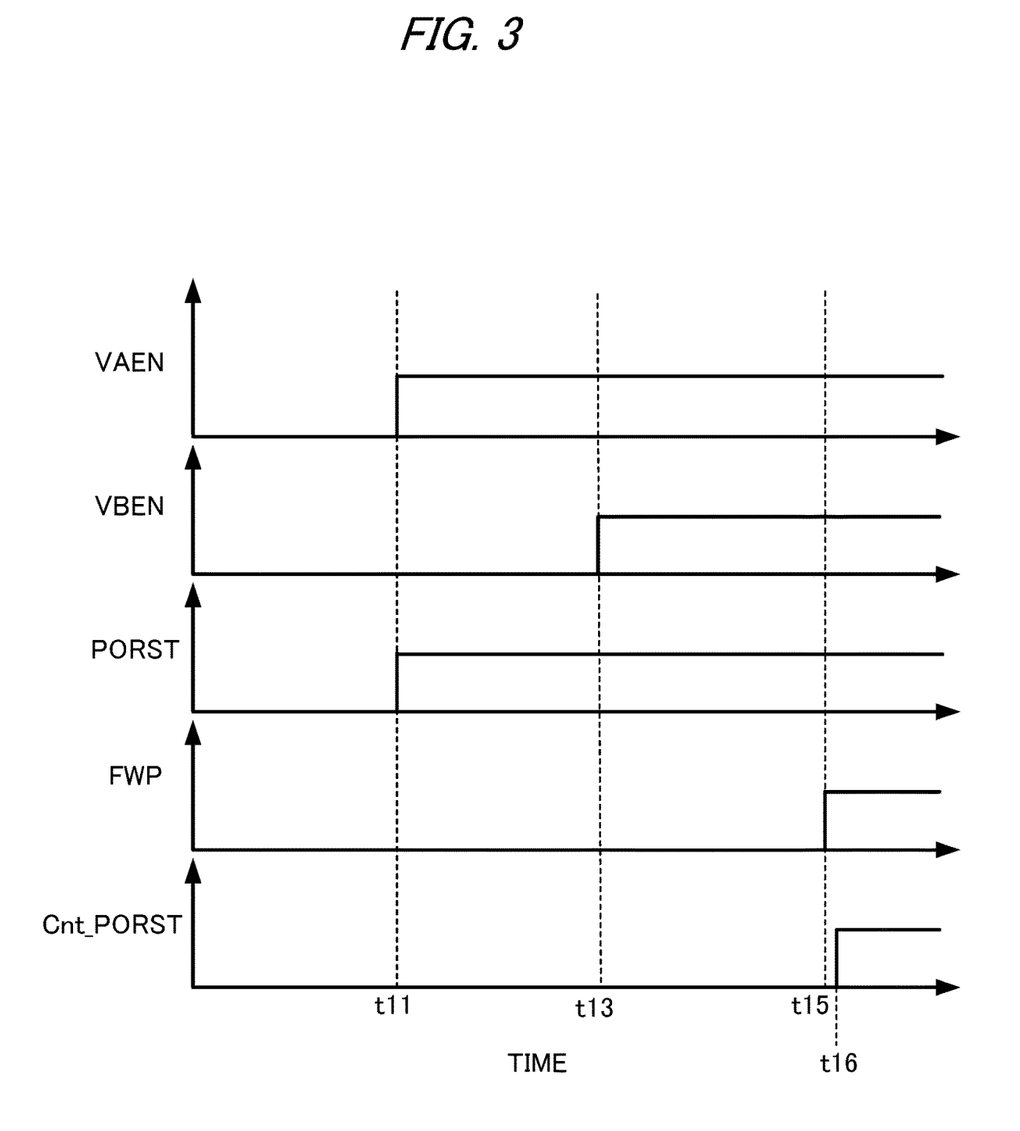

First, an operation of the flash memory system 1 after power-on will be explained with reference to FIGS. 2 and 3. FIG. 2 is a voltage waveform diagram illustrating variations in the first voltage V1, second voltage V2, and third voltage V3a after the power-on. FIG. 3 is a time chart illustrating variations in the enable signals VAEN and VBEN, detection signal PORST, write protect signal FWP, and power-on reset control signal Cnt_PORST after the power-on. It should be noted that FIG. 2 illustrates the first voltage V1 without the voltage of the external power, because the voltage of the external power is approximately equal to the first voltage V1 despite of a voltage difference caused by the voltage drop at the diode D1.

After the power-on at time t10, the voltage of the external power and the first voltage V1 rise. When the voltage of the external power reaches the threshold level VA at time t11, the detection circuit 36 activates the enable signal VAEN, so that the enable signal VAEN is changed from the low level to the high level, as illustrated in FIG. 3. This change causes the step-up circuit 32 to start a voltage boosting operation and makes the switching circuit SW to the on state. After the start of the voltage boosting operation of the step-up circuit 32, the backup capacitor C is charged and the level of the second voltage V2 to be input to the step-down circuits 34a to 34d starts to rise.

At the time t11, the detection circuit 36 activates the detection signal PORST, so that the detection signal PORST is changed to the high level (reset termination level). In contrast, the write protect signal FWP output from the detection circuit 41 remains at the low level indicating the inactive state because the third voltage V3a is lower than the threshold level VC. Accordingly, the power-on reset control signal Cnt_PORST, which is the logical and between the detection signal PORST and the write protect signal FWP, is maintained at the low level indicating the inactive state. Since the power-on reset control signal Cnt_PORST output from the logic circuit 42 is at the low level at this time, the memory controller 20 is not allowed to exit the reset state.

At time t12, the first voltage V1 reaches a preset level (for example, 3.3 V). Then, when the second voltage V2 reaches the threshold level VB at time t13, the detection circuit 35 activates the enable signal VBEN, so that the enable signal VBEN is changed from the low level to the high level. Although the threshold level VA is equal to the threshold level VB in the illustrated example, these voltages may also be different from each other. In response to activation of the enable signal VBEN by the detection circuit 35, the step-down circuit 34a starts the operations, thereby causing the third voltage V3a to start to rise, and the discharging circuit 33 is disconnected. It should be noted that the discharging circuit 33 was in the conductive state from the start of the operations of the step-up circuit 32 until the disconnection. This configuration does not inhibit the second voltage V2 from rising because the current fed from the step-up circuit 32 is sufficiently larger than the current discharged by the discharging circuit 33.

At time t14, the second voltage V2 reaches a preset level (for example, 5.0 V). Then, when the third voltage V3a reaches the threshold level VC at time t15, the detection circuit 41 changes the write protect signal FWP to a high level (write protect termination level). This change causes the flash memory 10 to exit the write protect state and allows data to be written into the flash memory 10.

The power-on reset control signal Cnt_PORST output from the logic circuit 42 is a signal corresponding to the logical and between the detection signal PORST and the write protect signal FWP. Accordingly, in response to the change of the write protect signal FWP to the high level at the time t15, the power-on reset control signal Cnt_PORST is changed from the low level to the high level at the time t16. That is, since the detection signal PORST has been at the high level since the time t11, after the change of the write protect signal FWP to the high level at the time t15, both signals to be input to the logic circuit 42 are at the high level. In response to this change, the power-on reset control signal Cnt_PORST is changed to the high level.

In general, a logic circuit should ideally cause no circuit delay. An actual logic circuit, however, causes a slight delay on the order of nanoseconds between the input and output terminals, due to a delay in switching between the on and off states of the transistor, for example. In this embodiment, this slight delay is used to put the timing of activation of the memory controller 20 behind the timing of activation of the flash memory 10. Slightly after the change of the write protect signal FWP to the high level at the time t15, the signal output from the logic circuit 42 changes at the time t16. Accordingly, the write protect signal FWP indicates termination of the write protect state, and then the power-on reset control signal Cnt_PORST indicates termination of the rest state.

As a result, after the flash memory 10 is made writable, the memory controller 20 is allowed to exit the reset state and becomes accessible to the flash memory 10. This configuration enables the memory controller 20 in the active state to always recognize the flash memory 10. The configuration can therefore avoid errors during boosting of the system caused by failures in recognition of the flash memory 10 by the memory controller 20.

As explained above, since the write protect signal FWP is one of the signals input to the logic circuit 42, the change of the write protect signal FWP to the write protect termination level is followed by the change of the power-on reset control signal Cnt_PORST (output signal) to the reset termination level. The time difference between the time t15 of the change of the write protect signal FWP to the write protect termination level and the time t16 of the change of the power-on reset control signal Cnt_PORST to the reset termination level is generated using a delay that naturally occurs in the configuration of the logic circuit 42. That is, no special mechanism is required to generate the time difference. In addition, since this delay is an extremely short time of approximately several nanoseconds, the memory controller 20 can access the flash memory 10 an extremely short time after the activation of the flash memory 10. This configuration can reduce the time required for boosting the flash memory system 1.

At time t17, the third voltage V3a reaches the preset level.

Figure 4:
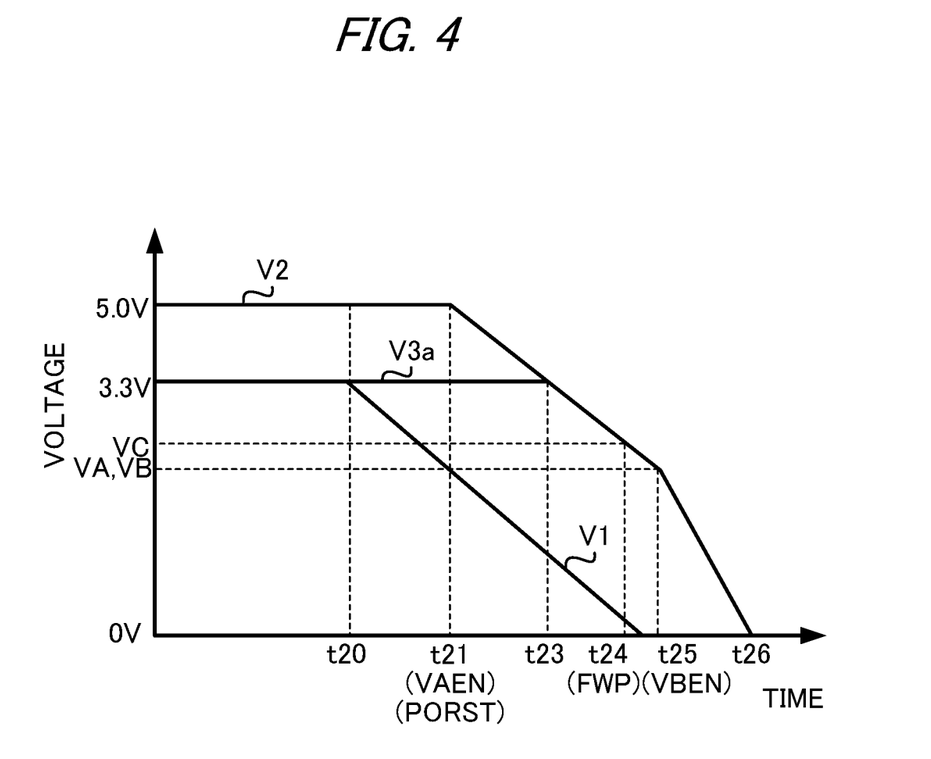
FIG. 4 is a voltage waveform diagram illustrating a variation in power supply voltage after power shutdown.
Figure 5:
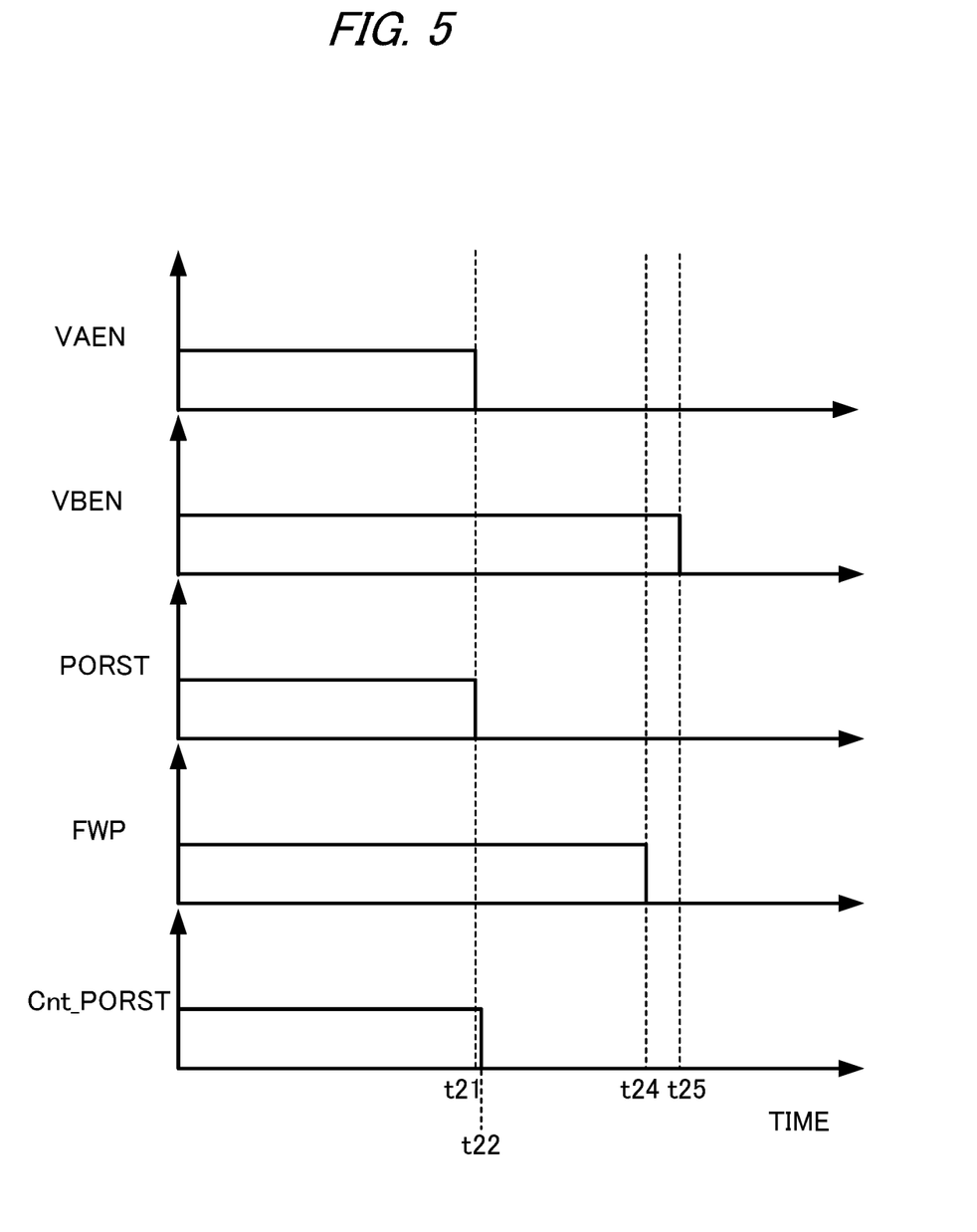
FIG. 5 is a time chart illustrating signals input to a logic circuit and a signal output from the logic circuit after power shutdown.

Second, an operation of the flash memory system 1 after power shutdown will be explained with reference to FIGS. 4 and 5. FIG. 4 is a voltage waveform diagram illustrating variations in the first voltage V1, second voltage V2, and third voltage V3a after the power shutdown. FIG. 5 is a time chart illustrating variations in the enable signals VAEN and VBEN, detection signal PORST, write protect signal FWP, and power-on reset control signal Cnt_PORST after the power shutdown. It should be noted that FIG. 4 illustrates the first voltage V1 without the voltage of the external power, because the voltage of the external power is approximately equal to the first voltage V1 despite of a voltage difference caused by the voltage drop at the diode D1.

After shutdown of external power at time t20, the voltage of the external power and the first voltage V1 start to lower. In contrast, the second voltage V2 does not lower because the step-up circuit 32 is still operating at this time. The third voltage V3a therefore remains to be the preset level (for example, 3.3 V). When the voltage of the external power goes below the threshold level VA at time t21, the detection circuit 36 changes the enable signal VAEN to the signal level indicating deactivation. That is, the enable signal VAEN is changed to the low level. This change makes the switching circuit SW to the off state and causes the step-up circuit 32 to stop the voltage boosting operation, so that the second voltage V2 starts to lower. At the same time, the detection circuit 36 changes the detection signal PORST to the signal level indicating deactivation. That is, the detection signal PORST is changed to the low level. The detection signal PORST is input to the logic circuit 42.

Because of the detection signal PORST at the low level, the power-on reset control signal Cnt_PORST to be output from the logic circuit 42 is changed to the low level (reset level) regardless of the level of the write protect signal FWP, which is the other signal input to the logic circuit 42. The write protect signal FWP remains at the high level (write protect termination level) because the third voltage V3a does not lower at this time. A change of the signal output from the logic circuit 42 occurs several nanoseconds behind a change of the input signal, as explained above. The power-on reset control signal Cnt_PORST to be output from the logic circuit 42 is therefore changed to the low level at the time t22 slightly behind the time t21 of input of the detection signal PORST. The memory controller 20 stops the writing process (process of writing data into the flash memory 10 by the memory controller 20) because of the change of the power-on reset control signal Cnt_PORST to the low level, while the ongoing writing process continues in the flash memory 10 because of the write protect signal FWP remaining at the high level. It should be noted that the electric charge stored in the capacitor C is defined such that the power supply continues until the completion of the writing process in the flash memory 10.

At the time t21, the enable signal VAEN is changed to the signal level indicating deactivation and causes the step-up circuit 32 to stop the voltage boosting operation. This step is followed by the stop of the memory controller 20 at the time t22, resulting in a reduction in power consumption in the flash memory system 1. During the period between the times t21 to t23, the third voltage V3a is maintained at the preset level (3.3 V) because of the charged voltage in the backup capacitor C higher than the preset level (3.3 V). During the period between the times t23 to t24, the third voltage V3a lowers because of the second voltage V2 of the preset level (3.3 V) or lower.

When the third voltage V3a goes below the threshold level VC at the time t24, the detection circuit 41 changes the write protect signal FWP to the write protect level (low level). This change makes the flash memory 10 to the write protect state, resulting in inhibition of data writing. As explained above, after power shutdown, the memory controller 20 is deactivated and prevented from accessing the flash memory 10, in advance of deactivation of the flash memory 10. The period between the times t22 to t24 is defined to be at least the time required for the writing process in the flash memory 10. This configuration can achieve deactivation of the flash memory 10 after completion of all the remaining writing processes in the flash memory 10 in the case of incompletion of the writing processes. This configuration can avoid writing errors in the flash memory system 1 after power shutdown. When the second voltage V2 goes below the threshold level VB at the time t25, the detection circuit 35 changes the enable signal VBEN to the signal level indicating deactivation. This change causes the step-down circuit 34a to stop the operations. Furthermore, the discharging circuit 33 is made to the conductive state and therefore causes the electric charge stored in the capacitor C to be rapidly discharged.

As explained above, the flash memory system 1 according to the embodiment controls the active or inactive state of the flash memory 10 based on the level of the third voltage V3a, which is the operating voltage of the flash memory 10 lowered by the step-down circuit 34a. The flash memory system 1 also controls the active or inactive state of the memory controller 20 based on both of the levels of the voltage of the external power and the third voltage V3a. This configuration can always put the timing of activation of the memory controller 20 behind the timing of activation of the flash memory 10 after power-on. The configuration can also enable the memory controller 20 to certainly recognize the flash memory 10 during boosting of the system. Furthermore, because of the timing of activation of the memory controller 20 immediately after the timing of activation of the flash memory 10, the configuration can reduce the time required for boosting the system.

The detection circuit 36 outputs the detection signal PORST (first detection signal) of which the signal level is changed in response to arrival of the voltage of the external power at the threshold level VA or higher, while the detection circuit 41 outputs the write protect signal FWP (second detection signal) of which the signal level is changed in response to arrival of the third voltage V3a at the threshold level VC or higher. The logic circuit 42 then outputs the logical and between the first detection signal and the second detection signal. The signal output from the logic circuit 42 is input to the memory controller 20 in the form of the power-on reset control signal Cnt_PORST that makes the memory controller 20 to the active state. The logic circuit 42 causes a delay, which can put the timing of activation of the memory controller 20 behind the timing of activation of the flash memory 10. Since the timing of activation of the memory controller 20 is controlled by the signal output from the logic circuit 42, the memory controller 20 can be activated immediately after the activation of the flash memory 10. Such a time difference between the timings of activation is generated using a slight delay in a variation of the logical value, for example, due to a time of switching between the on and off states of the transistor, in the actual logic circuit 42. That is, the slight time difference on the order of nanoseconds can be generated by a simple configuration without any additional circuit for providing a delay time. This configuration can also reduce the delay time occurred during boosting of the system because of an extremely slight time difference between the timing of activation of the flash memory 10 and the timing of activation of the memory controller 20.

According to the embodiment, the enable signal VAEN and the detection signal PORST are detected based on the same threshold level VA and output from the common detection circuit 36. This configuration can reduce the number of components. Alternatively, the enable signal VAEN and the detection signal PORST may be detected based on mutually different threshold levels and different delay times and may be output from individual detection circuits. For example, the threshold level for detection of the detection signal PORST should preferably be higher than the threshold level for detection of the enable signal VAEN. This configuration can achieve the reset of the memory controller 20 in advance of the backup operation by the capacitor C after power shutdown. In addition, the power supply voltage from the external source is directly input to the detection circuit 36 according to the embodiment. The detection circuit 36 may be provided with a level shift circuit on the output side so as to adjust the power-on reset control signal Cnt_PORST output from the detection circuit 36 to the input to the memory controller 20.

According to the embodiment, the active or inactive state of the memory controller 20 is controlled by the signal output from the logic circuit 42. Alternatively, the active or inactive state of the memory controller 20 may be controlled by a microcomputer, for example. In this case, the microcomputer monitors the write protect signal FWP output from the detection circuit 41 and the detection signal PORST output from the detection circuit 36. When both of the signals are changed to the signal level indicating activation, the microcomputer may change the power-on reset control signal Cnt_PORST to the signal level indicating activation. The timing of activation may be adjusted depending on a predetermined delay time. This delay time may be variable.

According to the embodiment, the active or inactive state of the flash memory 10 is controlled by the write protect signal FWP, while the active or inactive state of the memory controller 20 is controlled by the power-on reset control signal Cnt_PORST. Alternatively, various signals may be used to control the active or inactive states of the flash memory 10 and the memory controller 20.

Figure 6:
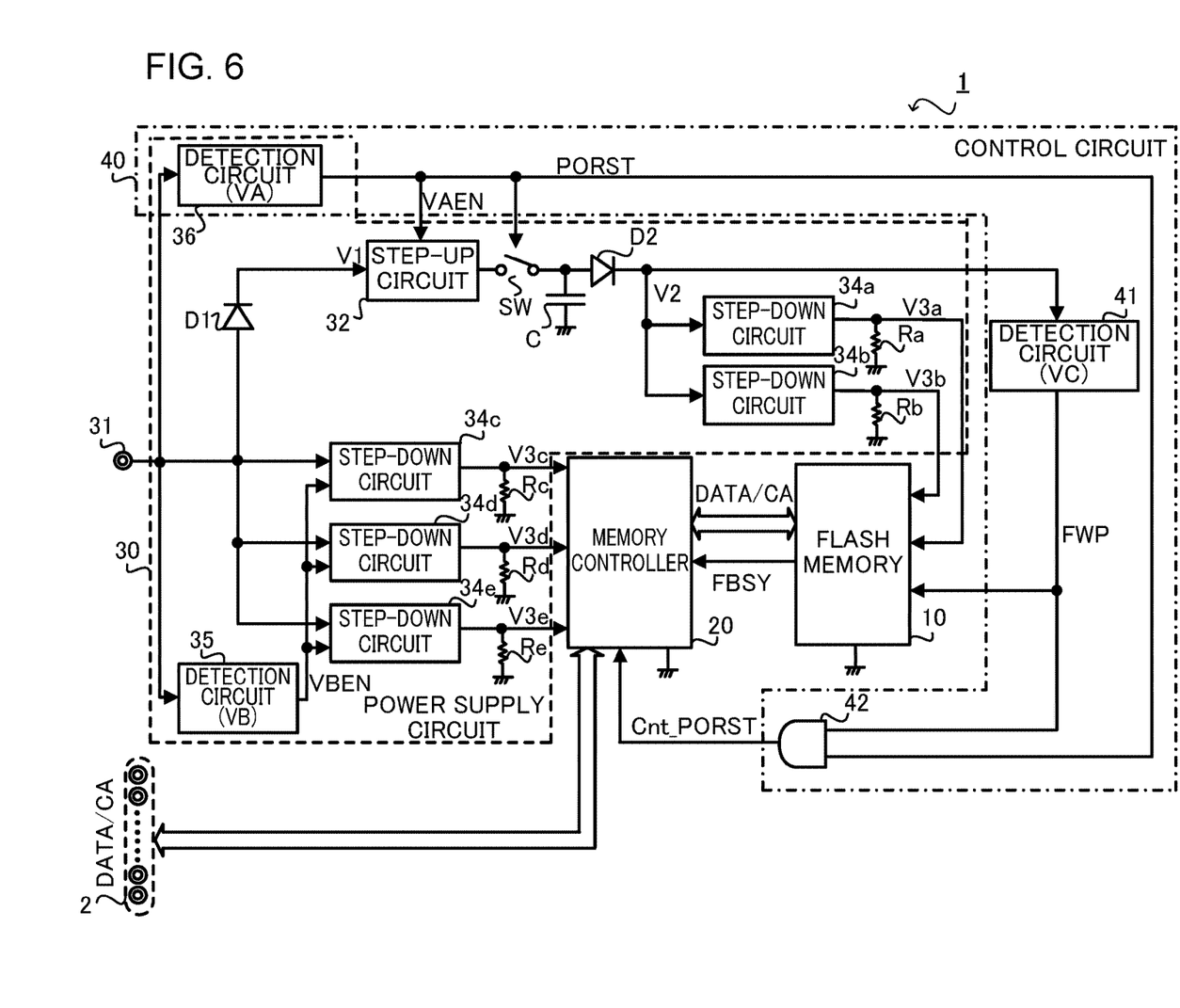
FIG. 6 is a block diagram illustrating a configuration of a flash memory system according to Embodiment 2 of the disclosure.

Alternatively, according to Embodiment 2 of the disclosure, as in the circuit configuration illustrated in FIG. 6, the electric charge stored in the capacitor C may be used as backup power for only the flash memory 10. In this configuration, power is fed to the flash memory 10 via the step-up circuit 32 and the capacitor C and is fed to the memory controller 20 not via the step-up circuit 32 or the capacitor C. The step-down circuits 34a and 34b lower the second voltage V2 and thereby generate third voltages V3a and V3b to be fed to the flash memory 10 as the operating voltage. The step-down circuits 34c, 34d, and 34e lower the power supply voltage and thereby generate fourth voltages V3c, V3d, and V3e to be fed to the memory controller 20 as the operating voltage. According to the embodiment, the step-down circuits 34a and 34b are each an exemplary first step-down circuit for supplying the lowered power supply voltage to the flash memory 10, and the step-down circuits 34c, 34d, and 34e are each an exemplary second step-down circuit for supplying the lowered power supply voltage to the memory controller 20. The detection circuit 41 monitors the level of the second voltage V2 output from the step-up circuit 32 and generates the write protect signal FWP that makes the flash memory 10 to the active or inactive state. The detection signal PORST output from the detection circuit 36 and the write protect signal FWP output from the detection circuit 41 are input to the logic circuit 42. The logic circuit 42 then outputs the power-on reset control signal Cnt_PORST that makes the memory controller 20 to the active or inactive state.

Figure 7:
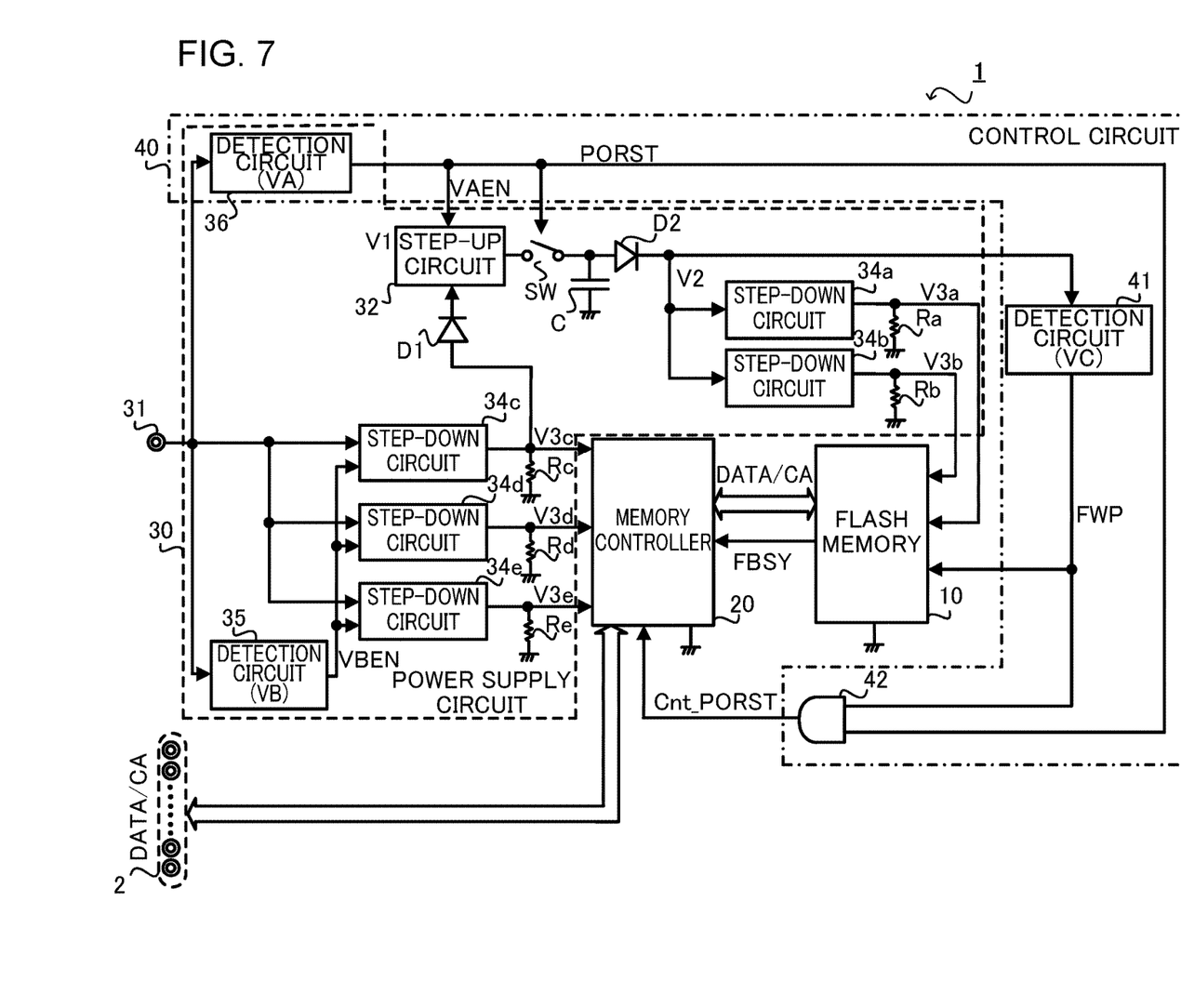
FIG. 7 is a block diagram illustrating a configuration of a flash memory system according to Embodiment 3 of the disclosure.

Alternatively, according to Embodiment 3 of the disclosure, as in the circuit configuration illustrated in FIG. 7, the power supply voltage to be fed to the memory controller 20 may be input to the step-up circuit 32.

Although the step-up circuit 32 and the capacitor C are provided with the switching circuit SW therebetween according to the above-described embodiments, such an individual switching circuit SW may be excluded if the step-up circuit 32 has the function of the switching circuit SW.

The diodes D1 and D2 for preventing backflow according to the above-described embodiments may be excluded. This modification can reduce the number of components and eliminate voltage drops at the diodes.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A flash memory system comprising:
   a memory controller;
   a flash memory configured to be controlled by the memory controller;
   a power supply circuit configured to supply operating voltage to the memory controller and the flash memory; and
   a control circuit configured to control active or inactive states of the memory controller and the flash memory, wherein
   the power supply circuit comprises:
      a power supply terminal fed with external power;
      a step-up circuit for boosting a first voltage associated with the external power and thereby generating a second voltage higher than the first voltage;
      a capacitor charged at the second voltage; and
      a first step-down circuit for lowering the second voltage and thereby generating a third voltage lower than the second voltage, and supplying the generated third voltage to the flash memory as the operating voltage, and
   the control circuit comprises:
      a circuit for controlling the active or inactive state of the flash memory based on a level of the third voltage; and
      a circuit for controlling the active or inactive state of the memory controller based on both of a level of voltage of the external power and the level of the third voltage.

2. The flash memory system according to claim 1, wherein the power supply circuit further comprises a second step-down circuit for lowering the first voltage or the second voltage and thereby generating a fourth voltage lower than the first voltage or the second voltage, and supplying the generated fourth voltage to the memory controller as the operating voltage.

3. A flash memory system comprising:
   a memory controller;
   a flash memory configured to be controlled by the memory controller;
   a power supply circuit configured to supply operating voltage to the memory controller and the flash memory; and
   a control circuit configured to control active or inactive states of the memory controller and the flash memory, wherein
   the power supply circuit comprises:
      a power supply terminal fed with external power;
      a step-up circuit for boosting a first voltage associated with the external power and thereby generating a second voltage higher than the first voltage;
      a capacitor charged at the second voltage; and
      a first step-down circuit for lowering the second voltage and thereby generating a third voltage lower than the second voltage, and supplying the generated third voltage to the flash memory as the operating voltage, and
   the control circuit comprises:
      a circuit for controlling the active or inactive state of the flash memory based on a level of the second voltage; and
      a circuit for controlling the active or inactive state of the memory controller based on both of a level of voltage of the external power and the level of the second voltage.

4. The flash memory system according to claim 3, wherein the power supply circuit further comprises a second step-down circuit for lowering the first voltage or the second voltage and thereby generating a fourth voltage lower than the first voltage or the second voltage, and supplying the generated fourth voltage to the memory controller as the operating voltage.

5. A flash memory system comprising:
   a memory controller;
   a flash memory configured to be controlled by the memory controller;
   a power supply circuit configured to supply operating voltage to the memory controller and the flash memory; and
   a control circuit configured to control active or inactive states of the memory controller and the flash memory, wherein
   the power supply circuit comprises:
      a power supply terminal fed with external power;
      a step-up circuit for boosting a first voltage associated with the external power and thereby generating a second voltage higher than the first voltage;
      a capacitor charged at the second voltage; and
      a first step-down circuit for lowering the second voltage and thereby generating a third voltage lower than the second voltage, and supplying the generated third voltage to the flash memory as the operating voltage, and
   the control circuit comprises:
      a detection circuit for outputting a first detection signal varying depending on detection of whether a voltage of the external power is at least a first threshold level;
      a detection circuit for outputting a second detection signal varying depending on detection of whether the second voltage or the third voltage is at least a second threshold level; and
      a logic circuit for providing a logical and between the first detection signal and the second detection signal.

6. The flash memory system according to claim 5, wherein
   the active or inactive state of the memory controller is controlled based on a signal output from the logic circuit, and
   the active or inactive state of the flash memory is controlled based on the second detection signal.

7. The flash memory system according to claim 5, wherein the power supply circuit further comprises a second step-down circuit for lowering the first voltage or the second voltage and thereby generating a fourth voltage lower than the first voltage or the second voltage, and supplying the generated fourth voltage to the memory controller as the operating voltage.

\* \* \* \* \*